United States Patent [19]

Kobayashi et al.

[11] Patent Number: 4,866,273

[45] Date of Patent: Sep. 12, 1989

[54] ELECTRON-MICROSCOPIC IMAGE VIEWING SYSTEM

[75] Inventors: Hiroyuki Kobayashi, Mito; Shoji Kamimura, Katsuta, both of Japan

[73] Assignee: Hitachi, Ltd., Tokyo, Japan

[21] Appl. No.: 242,129

[22] Filed: Sep. 9, 1988

[30] Foreign Application Priority Data

Sep. 11, 1987 [JP] Japan ................................ 62-227994

[51] Int. Cl.$^4$ ............................................. H01J 37/26
[52] U.S. Cl. .................................... 250/311; 250/310
[58] Field of Search ............................... 250/311, 310

[56] References Cited

U.S. PATENT DOCUMENTS 4,091,374 5/1978 Muller et al. ......................... 250/311
4,146,788 3/1979 Mirkin et al. ......................... 250/310

OTHER PUBLICATIONS

Isakozawa et al., Proc. of 43rd Ann. Meeting of the Electron Microscopy Society of America, 1985, pp. 140–141.

Kobayashi et al., Proc. XIth Cong. on Electron Microscopy, Kyoto, 1986, pp. 453–454.

Primary Examiner—Jack I. Berman
Attorney, Agent, or Firm—Antonelli, Terry & Wands

[57] ABSTRACT

A viewing system destined to be employed in association with a transmission electron microscope, which system comprises a converter for converting an image of a specimen focused by a focusing lens system of the electron microscope into an electric signal, a frame memory for processing the electric signal obtained from the converter for each image frame to thereby derive image frame data to be stored therein, a display unit for displaying an electron-microscopic image with or without other data on the basis of the contents of the frame memory, a simulator for deriving a simulated image corresponding to the electron microscopic image, a simulation frame memory for processing the simulated image data derived through the simulated image deriving unit for each image frame to thereby store data resulting from the processing and displaying a simulated image on the basis of the output of the simulation frame memory, wherein the conditions required for deriving the simulated image are transmitted from the unit for controlling the electron microscope to the simulated image deriving unit, whereby at least portions of the electron-microscopic image and the corresponding simulated image, respectively, are displayed concurrently.

5 Claims, 5 Drawing Sheets

ELECTRON-MICROSCOPIC IMAGE VIEWING SYSTEM

BACKGROUND OF THE INVENTION

The present invention relates generally to a system for viewing an image generated by an electron microscope. More particularly, the invention is concerned with an electron-microscopic image viewing system for a transmission electron microscope in which an image of a specimen or sample as generated by a transmission electron microscope and a corresponding image generated through simulation (referred to as the simulated image) can be concurrently displayed on a same or separate cathode ray tube (CRT) displays.

In recent years, electron microscope of a structure equipped with a television (TV) camera for allowing the electron-microscopic image to be viewed or examined on a CRT monitor as well as similar (transmission) electron microscope having expanded functions and applicabilities are manufactured on the commercial basis, as is reported in "Proceedings of the 43rd Annual Meeting of the Electron Microscopy Society of America", 1985, pp. 140–141, and "Proc. XI-th Cong. on Electron Microscopy in Kyoto", 1980, pp. 453–454.

However, the prior art electron microscope systems mentioned above are equipped with only the function of displaying and storing the image to be viewed.

In an electron microscope having an increased magnification of 20,000 to 30,000 so that a specimen or sample can be observed at the level of atom, such situation is often encountered in which an image being viewed presents utterly different appearance even when the conditions for observation are changed only a bit, e.g., with deviation of the focal point only a few hundred angstroms (Å). Further, in an electron diffractograph, diffraction intensity as well as diffraction pattern may undergo remarkable changes even with only a bit of change in the viewing conditions for observation.

Under the circumstances, interpretation of the electron-microscopic image (e.g. determination of atomic array, electron diffraction pattern and others) encounters a great difficulty.

To cope with the problem mentioned above, it has been practiced in the art to photograph an electronmicroscopic image under given viewing conditions while performing simulation on the same condition, wherein the electron-microscopic image or the like is interpreted or analyzed by comparing it with the simulated image (i.e. image obtained through simulation).

However, in the prior art systems, simulation of the electron-microscopic image or the like has been performed independent of observation and/or recording of the actual electron-microscopic image, involving thus troublesome and time consuming procedure in setting the conditions for simulation. In that case, the image will be simulated under the conditions differing from those set for the actual viewing or observation.

SUMMARY OF THE INVENTION

An object of the present invention is to solve the problems mentioned above by providing a system for viewing the electron-microscopic image or pattern in a (transmission) electron microscope which can ensure a significant improvement in respect to manipulatability or operability of the system inclusive of the electron microscope as well as reliability in the interpretation of the images or patterns as generated.

The above object can be accomplished by displaying simultaneously or concurrently not only an image (pattern) to be actually viewed but also a corresponding image generated through simulation on a same or common CRT or separate CRTs disposed as close as possible to each other.

More specifically, an electron-microscopic image (pattern) is taken by a TV camera to be displayed on a CRT monitor, while a corresponding image is concurrently generated through simulation on the same viewing conditions as the image pick-up by the TV camera, wherein both the electron-microscopic image and the simulated image are displayed separately on respective CRTs or alternatively on one and the same CRT simultaneously or concurrently on an image division basis through appropriate image processing.

In this manner, it is possible to view the image obtained by simulation (theoretical values) concurrently with observation of the actual electron-microscopic image or pattern, whereby interpretation of the latter can be facilitated with efficiency of the system being thus significantly enhanced.

According to another aspect of the invention, it is proposed that instead of inputting the conditions required for the simulation separately or independent from the inputting of those required for viewing the electron-microscopic image, the former is automatically selected from the latter and transferred to a simulator (e.g. computer) in the course of inputting of data by operator. In this case, the procedure for inputting the conditions or data for simulation can be spared. Additionally, possibility of erroneous inputting is excluded. Thus, the reliability and efficiency can be enhanced significantly.

DESCRIPTION OF THE PREFERRED EMBODIMENTS

Figure 1:
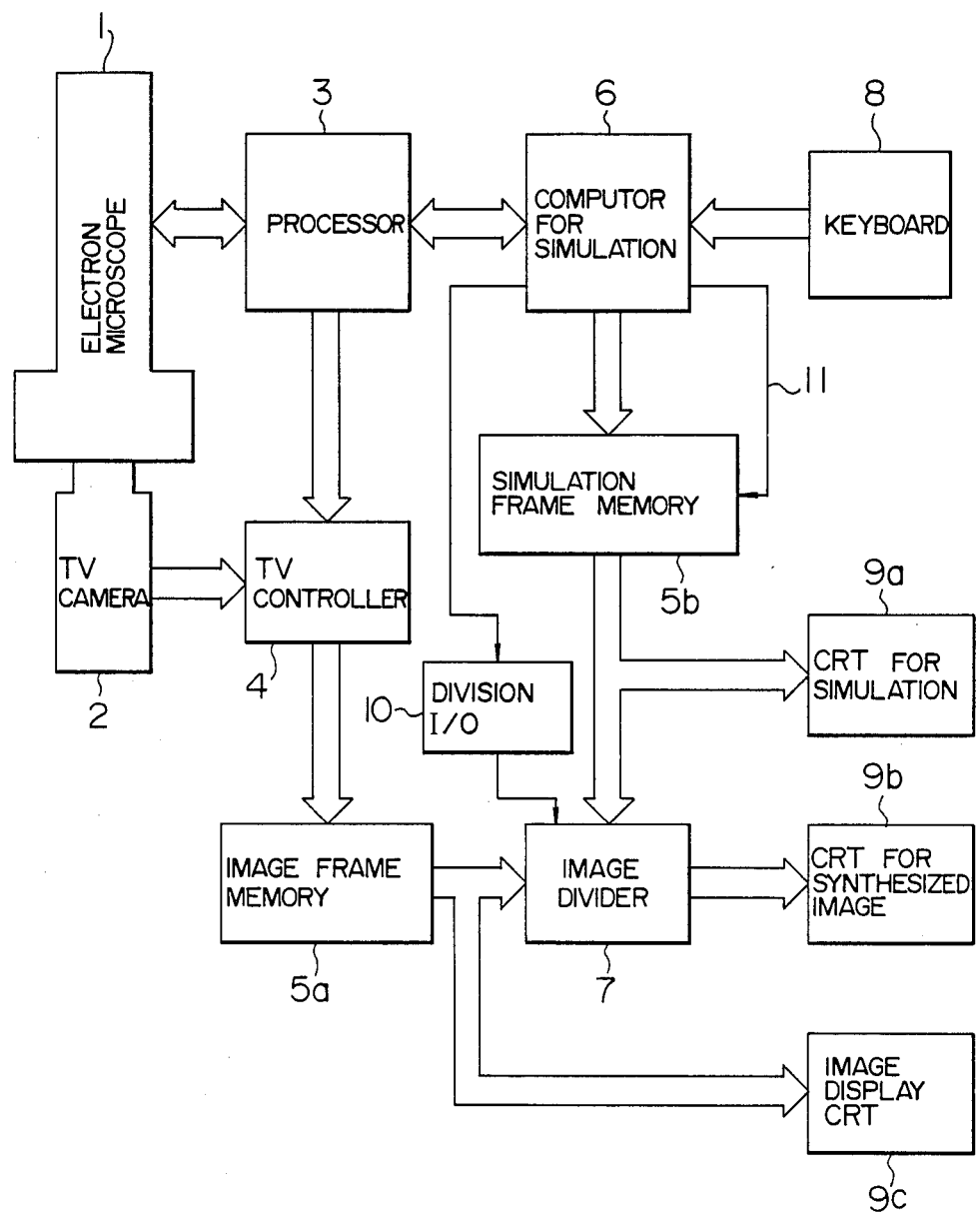
FIG. 1 shows in a block diagram a general arrangement of an electron-microscopic image viewing system according to an exemplary embodiment of the present invention.

FIG. 1 shows in a block diagram a general arrangement of an electron-microscopic image viewing system according to an exemplary embodiment of the present invention.

In the figure, a reference numeral 1 denotes an electron microscope of a conventional structure. The image of a specimen or sample generated by the electron microscope 1 is converted into an electric video signal by a television (TV) camera 2 to be subsequently stored in an image frame memory 5a by way of a TV controller 4.

Figure 2:
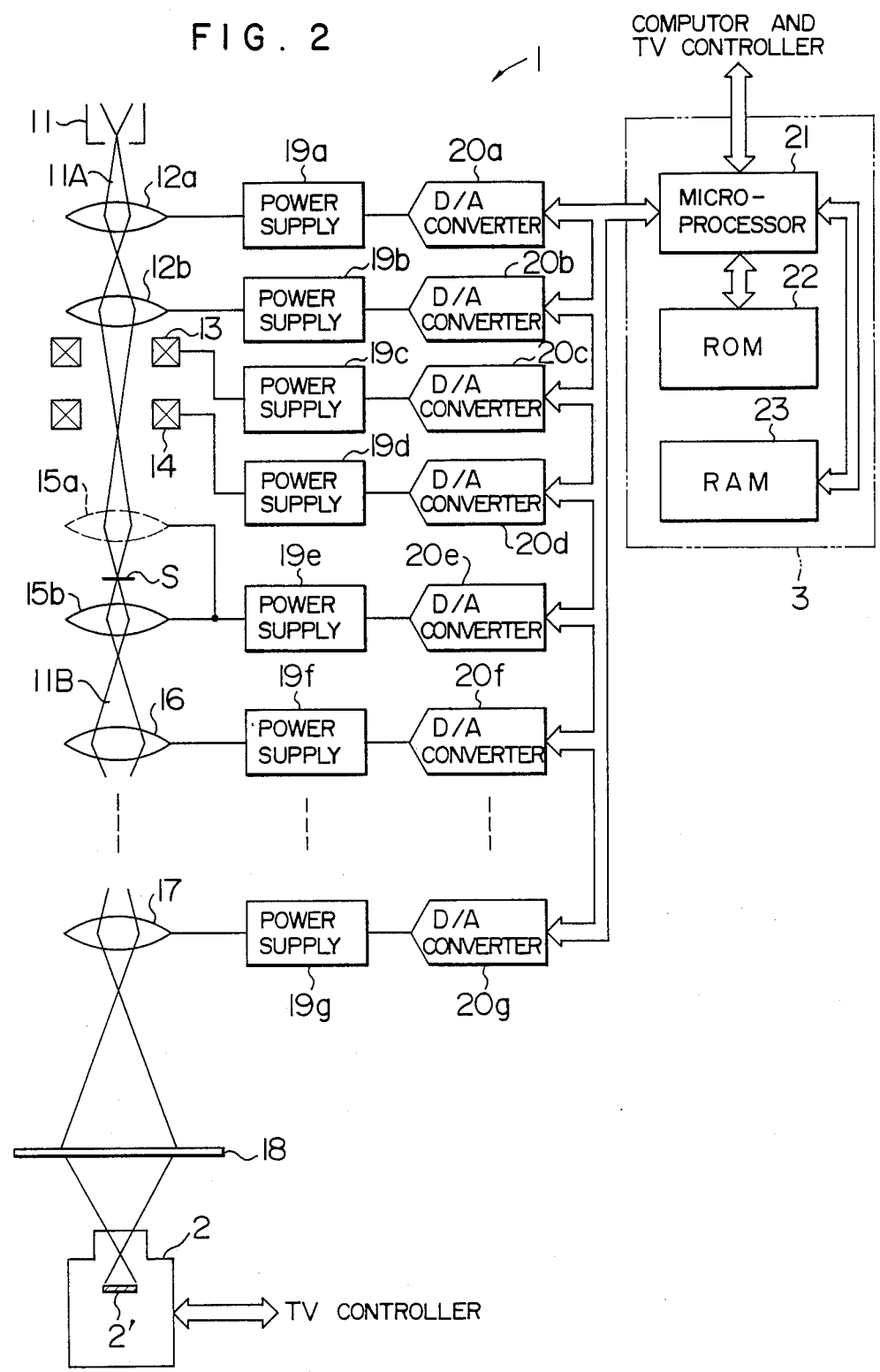
FIG. 2 shows in a schematic diagram a structure of a transmission electron microscope employed in the system shown in FIG. 1 together with a processor and a TV camera connected to the electron microscope in a block diagram.

FIG. 2 shows in a schematic diagram a structure of a transmission electron microscope 1 employed in the instant embodiment together with the television camera 2 and a processor 3 connected to the transmission microscope 1.

In the transmission electron microscope 1, an electron beam 11A emitted by an electron gun 11 is focused through illuminating lens systems 12a and 12b and a preobjective magnetic field lens 15a to irradiate a surface of a specimen S. Image of the specimen carried by the electron beam 11B transmitting through the specimen S is magnified by focusing or imaging lens systems 16 and 17 inclusive of the objective lens 15b to be projected onto a fluorescent plate 18. An astigmatism corrector 13 for the irradiating or illuminating lens system, an electron beam deflector 14 and excitations of the individual lenses are controlled by the processor 3 through D/A (digital-to-analogue) converters 20a to 20g and power supply sources 19a to 19g, respectively. The processor 3 is composed of a microprocessor unit 21, a read-only memory or ROM 22 and a random access memory or RAM 23, wherein the ROM 22 stores programs and data for control purpose, while the RAM 23 is designed to store the data for deflection of the electron beam and astigmatic correction. These two memories 22 and 23 are backed up by a predetermined back-up battery (not shown).

Disposed on the rear side of the fluorescent plate 18 is a TV camera 2 for taking the TEM image (transmission electron-microscopic image) of the specimen projected onto the fluorescent plate 18 by the transmission electron microscope or TEM to output a corresponding picture or video signal to the TV controller 4.

Figure 3:
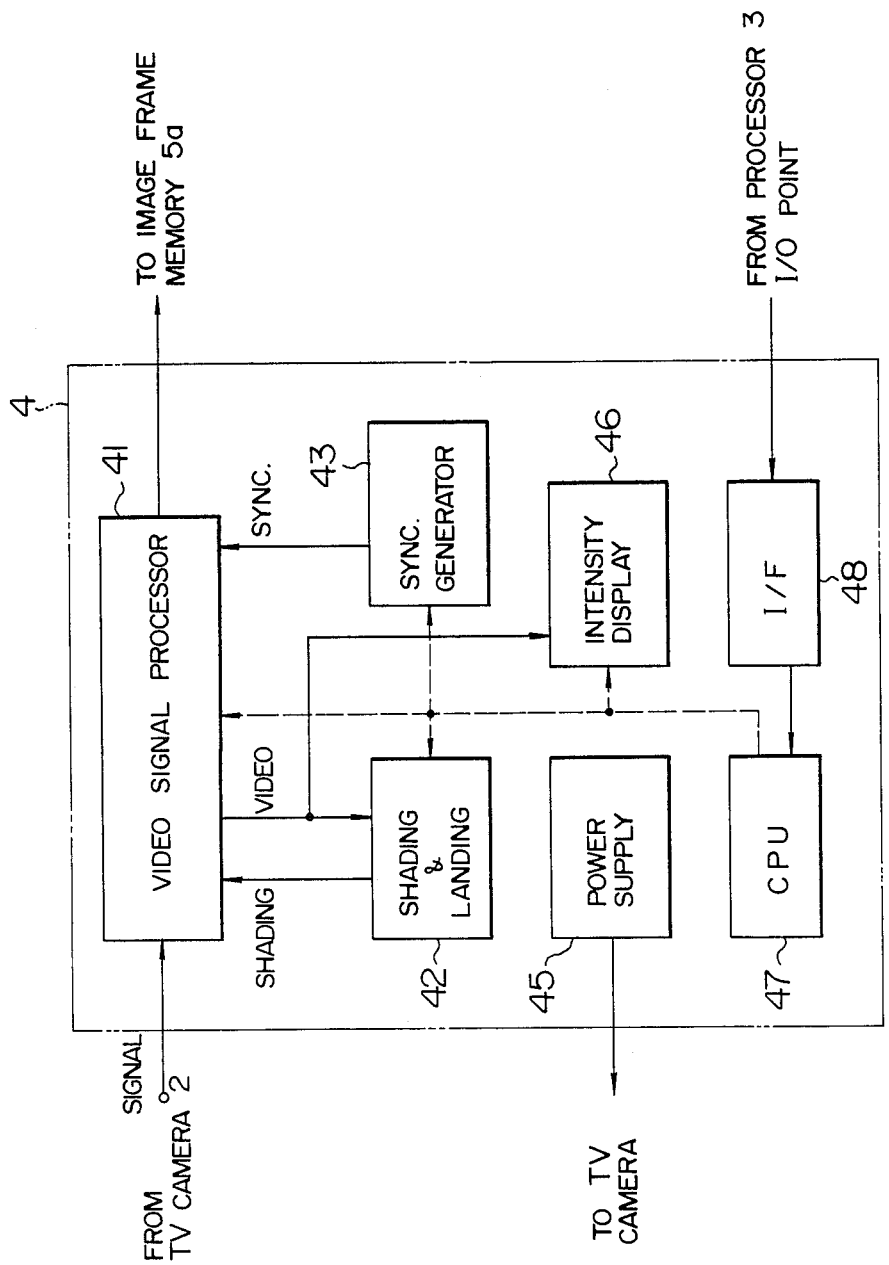
FIG. 3 shows in a block diagram details of a structure of a TV controller employed in the system shown in FIG. 1.

A structure of the TV controller 4 is shown in detail in FIG. 3. The signal outputted from the TV camera 2 and inputted to this TV camera 4 is amplified by a video signal processing circuit 41 incorporated therein through cooperation with a shading/landing correction circuit 42 and a synchronizing circuit 43, wherein the amplified TV signal is outputted to the image frame memory 5a. The TV controller 4 is controlled by a CPU 47 under the control command of the processor 3 (FIG. 2) inputted through an interface (I/F) circuit 48. The TV controller 4 also includes a power supply circuit 45 for supplying a power to operate the TV camera 2.

Turning back to FIG. 1, the output of the TV controller 4 is connected to the image frame memory 5a, which is implemented in such a structure which is essentially equivalent to that of the simulation frame memory 5b described hereinafter. A general arrangement of the image frame memory 5a is shown in a block diagram in FIG. 4.

Figure 4:
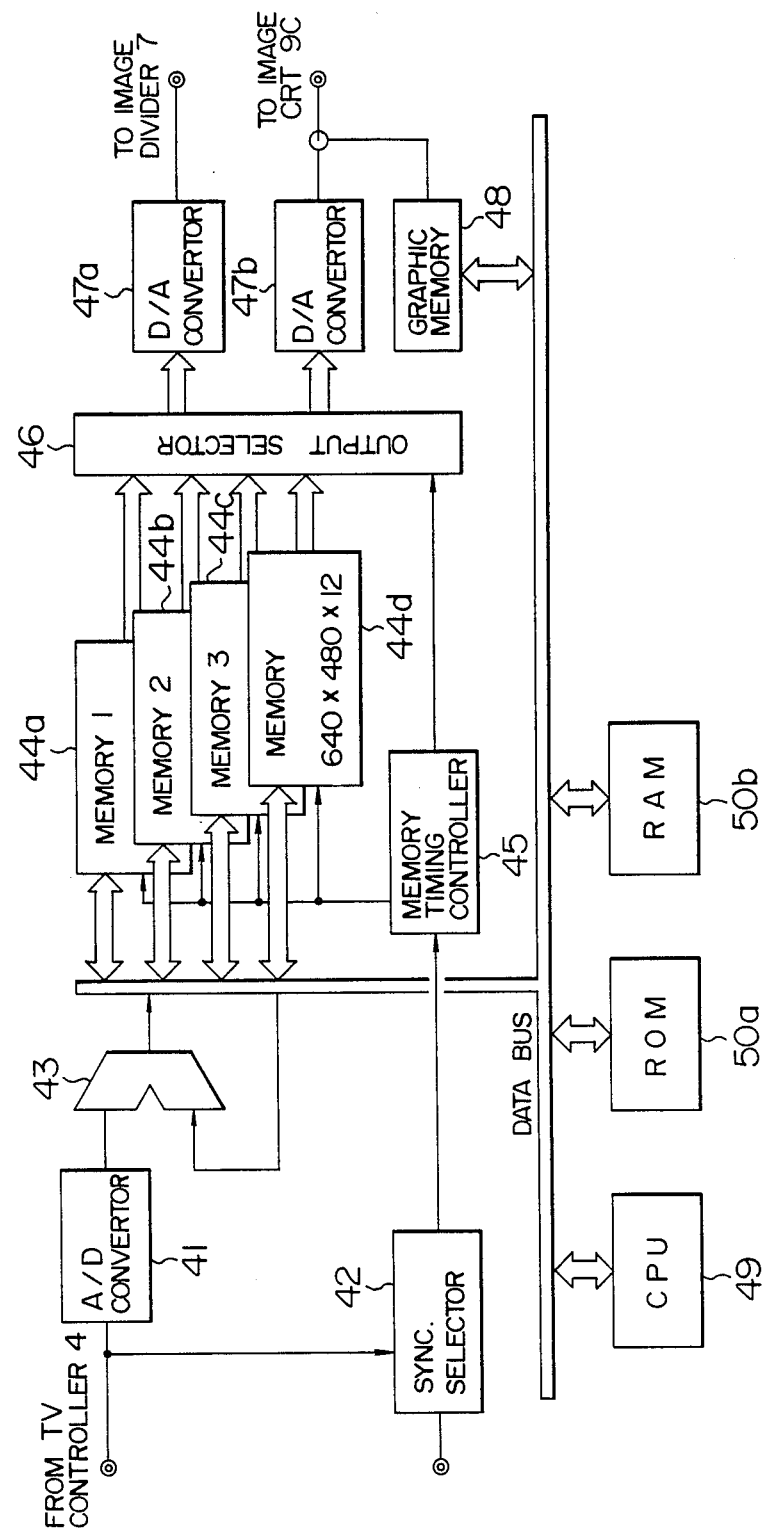
FIG. 4 is a block diagram showing in detail a structure of an image frame memory employed in the system shown in FIG. 1.

Referring to FIG. 4, the video signals outputted from the TV controller 4 as mentioned hereinbefore are converted into digital signals by an A/D converter 41 to be sequentially written into digital memories 44a to 44d by way of an arithmetic unit 43 in synchronism with the input video signal. On the other hand, the digital signals read out from the memories 44a to 44d are again converted into analogue signals by D/A converter 47a and 47b under synchronization by a memory timing controller 45 to be subsequently supplied to an image divider 7 and an image display CRT 9c.

Referring again to FIG. 1, the system includes a keyboard 8 and a computer 6 for simulation. Operation of the electron microscope 1 is controlled through input manipulation of the keyboard 8. More specifically, the keyboard 8 serves to input the data concerning an acceleration voltage required for observation by the electron microscope 1, voltage commands to the power supply sources 9a to 9g shown in FIG. 2 and data required for manipulating the TV camera 2. The data or conditions required for the observation are supplied to the processor 3 through the computer 6. In addition to the conditions for observation by the electron microscope, the conditions or data for observation by simulation such as accelerating voltage $C_s$ and $C_c$ of the objective lens, irradiating (illuminating) angle, incident angle, the number of waves partaking in the imaging, $\Delta E/E$, $\Delta I/I$ and others and the data of specimen such as grating constant, atomic scattering factor, thickness, crystal structure and others are inputted through the keyboard 8 to be used in th arithmetic operation for simulation executed by the computer 6.

Thus, the processor 3 controls the operation of the electron microscope 1 in accordance with the data inputted through the keyboard 8 and supplies constantly to the computer 6 the data indicating the accelerating voltage, magnification and focused state which partake in the simulation, whereby the updated observing conditions are always made available for the simulation even when the set conditions are changed. In this way, the computer 6 can create a simulated image corresponding to the TEM image of the electron microscope under observation through theoretical calculation procedure.

The result of simulation performed by the computer 6 is sent to a simulation frame memory 5b of a structure similar to that of the aforementioned image frame memory 5a.

The contents stored in the frame memory 5b are read out therefrom at a predetermined timing to be supplied to a CRT 9a, whereby an image created through the simulation is displayed on the image screen thereof.

The simulation under consideration is performed with the aid of values calculated on the basis of the electron diffraction theory which may be realized by resorting to the use of a multi-slice method well known in the art. Of course, the present invention is never restricted to any particular theory for the simulation, being thus understood that simulation based on other methods can be equally adopted without departing from the scope of the present invention.

The image divider 7 incorporates therein a built-in frame memory in which the outputs of the image frame memory 5a and the simulation frame memory 5b are stored. In other words, the contents stored in the image frame memory 5a, i.e. the video signal of an electronmicroscopic image exclusive of a portion thereof is stored in the frame memory incorporated in the image divider 7, wherein blank portion of the stored image corresponding to the excluded portion is fitted with a corresponding portion of the simulated image stored in the simulation frame memory 5b to be synthesized to one frame image, which is then outputted to a synthesized image CRT 9b to be displayed thereon.

In operation of the image divider 7, the conditions for the image division inputted from the keyboard 8 are supplied to the image divider 7 by way of the computer 6 and a division I/O (input/output) circuit 10. Thus, through manipulation of the keyboard by operator, the actual TEM image can be combined with the image of a given pattern resulting from the simulation, whereby a corresponding synthesized image is created.

Figure 5:
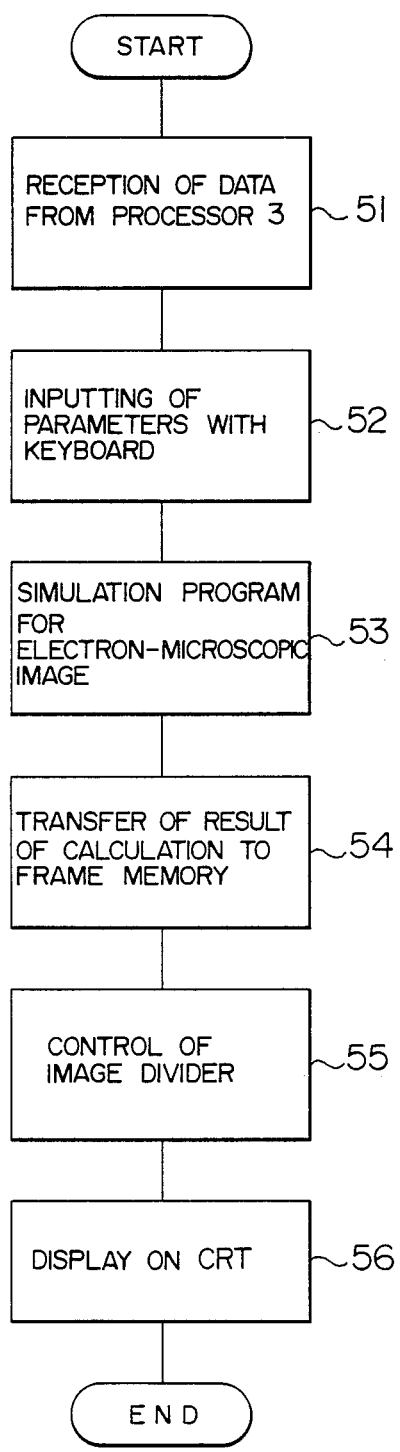
FIG. 5 is a flow chart illustrating an outline of the processing procedure executed by a computer employed in the system shown in FIG. 1.

FIG. 5 shows schematically in a flow chart an outline of the simulating operation performed by the computer 5, by way of example only. The computer 6 fetches various parameters inputted through the keyboard 8 while receiving the data from the processor (steps 51 and 52), to thereby execute arithmetic operation for simulation in accordance with a predetermined simulation program (step 53). The image data resulting from this arithmetic operation are transferred to the simulation frame memory 5b (step 54), while a synthesized image is displayed on the CRT 9b by controlling the image divider 7 (step 56).

Through the processing described above, the actual electron-microscopic image is displayed on the CRT 9c simultaneously with the display of the image generated through simulation of the CRT 9a for simulation.

In this manner, operator can view the simulated image on the simulation CRT 9a while viewing the microscopic image on the imaging CRT 9c by manipulating the electron microscope 1, whereby analysis and interpretation of the image can be performed rapidly and correctly. Further, manipulatability such as for the focusing purpose can be improved, whereby the efficiency of viewing and photographing operation can be significantly enhanced.

Further, the synthesized image resulting from combination of a portion of the actual microscopic image and a portion of the simulated image can be displayed in a divided form on one and the same screen of the CRT 9b. Accordingly, operator can make decision successfully whether a correct electron-microscopic image is obtained by referring to the synthesized image generated in the CRT 9b in the form of an integral image. Thus, interpretation of the image can be performed rapidly and correctly simply by viewing the synthesized image on the CRT 9b.

Parenthetically, the CRT 9b for the synthesized image is not necessarily to be combined together with the simulation CRT 9a. In other words, the pair of CRTs 9a and 9b may be replaced by the pair of CRTs 9a and 9c.

It will be useful to display the conditions for observation (such as the name of specimen, crystal structure, accelerating voltage, incident angle and the illuminating angle of beam, excitation currents, the angle of inclination of specimen and others) together with the simulated image (or electron-microscopic image) on one and the same screen. The processing for this end can be accomplished by writing the relevant data into the simulation frame memory 5b from the computer 6 through a character write line 11.

As will be appreciated from the foregoing description, by virtue of the capability of displaying concurrently the actually viewed TEM image and the image generated through simulation on the same conditions as the TEM image, interpretation of the image produced by the electron microscope as well as manipulatability thereof can be much facilitated.

In the foregoing description, it has been assumed that the image frame memory 5a and the simulation frame memory 5b are implemented separately independent of each other. However, the invention is never restricted to such arrangement. In other words, a single memory of a large capacity may be used for the same purpose by dividing it into two predetermined areas functioning as the memories 5a and 5b.

In connection with interpretation of the electron-microscopic image, it is sometimes experienced that the interpretation may differ under the influence of contrast of the image. Accordingly, it is desirable to equalize the contrasts of both actual TEM image and the simulated image regardless of whether both images are displayed on the separate CRTs 9a and 9c or on a single display unit. Such equalization of contrast can be accomplished through the imaging control by the TV controller 4 or adjustment of the conditions for simulation by the computer 6 through manipulation of the keyboard 8.

We claim:

1. A viewing system for a transmission electron microscope, comprising:

a converting means for converting an image of a specimen focused by a focusing lens system of said electron microscope into an electric signal;

frame memory means for processing the electric signal obtained from said converting means for each image frame to thereby derive image frame data to be stored therein;

display means for displaying an electron-microscope image on the basis of the contents of said frame memory means;

means for deriving a stimulated image corresponding to said electron microscope image.

simulation frame memory means for processing a simulated image data derived through said simulated image deriving means for each image frame to thereby store data resulting from the processing;

display means for displaying a simulated image on the basis of the output of said simulation frame memory means;

means for controlling said electron microscope; and means for transmitting conditions required for deriving said simulated image from said means for controlling said electron microscope to said simulated image deriving means so that at least portions of the electron-microscope image and the corresponding simulated image, respectively, are displayed concurrently.

2. A viewing system for an electron microscope according to claim 1, further comprising means for displaying said electron-microscope image and the corresponding simulated image on a common display unit.

3. A viewing system for an electron microscope according to claim 2, further comprising means for synthesizing said electron-microscope image and said simulated image in a given structural pattern which is displayed on said common display unit.

4. A viewing system for an electron microscope according to claim 1, wherein a single memory comprises areas serving as said frame memory means and said simulation frame memory means, respectively.

5. A viewing system for an electron microscope according to claim 2, further comprising means for adjusting the contrasts of said electron-microscope image and said simulation images in coordination.

* * * * *